(12) United States Patent
Thacker et al.

(10) Patent No.: US 9,136,237 B2
(45) Date of Patent: Sep. 15, 2015

(54) ELECTROPLATED SOLDER FOR HIGH-TEMPERATURE INTERCONNECT

(71) Applicant: Oracle International Corporation, Redwood City, CA (US)

(72) Inventors: Hiren D. Thacker, San Diego, CA (US); John E. Cunningham, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/109,616

(22) Filed: Dec. 17, 2013

(65) Prior Publication Data

US 2015/0171040 A1 Jun. 18, 2015

(51) Int. Cl.
  H01L 23/48 (2006.01)
  H01L 21/44 (2006.01)
  H01L 23/00 (2006.01)

(52) U.S. Cl.
  CPC ............ *H01L 24/14* (2013.01); *H01L 24/11* (2013.01)

(58) Field of Classification Search
  USPC .......... 257/737, 738, E23.021, E23.069; 438/612–617; 228/180.22
  See application file for complete search history.

(56) References Cited

U.S. PATENT DOCUMENTS

| 3,986,255 A | * | 10/1976 | Mandal ............. 29/840 |
| 4,922,322 A | * | 5/1990 | Mathew ........... 257/737 |
| 6,153,940 A | * | 11/2000 | Zakel et al. ........ 257/779 |

* cited by examiner

*Primary Examiner* — Jasmine Clark
(74) *Attorney, Agent, or Firm* — Park, Vaughan, Fleming & Dowler LLP; Steven E. Stupp (57) ABSTRACT

This chip package includes a substrate having a multilayer electroplated stack disposed on a surface of the substrate. The multilayer electroplated stack may include one or more instances of alternating layers of gold and tin, where relative thicknesses of the alternating layers, when melted, result in a chemical composition having an initial melting temperature to form a bump and a subsequent melting temperature to reflow the bump that is higher than the initial melting temperature. For example, the chemical composition may correspond to a non-equilibrium gold-tin alloy.

20 Claims, 8 Drawing Sheets

```
DISPOSE A GOLD LAYER ON A FIRST SURFACE OF A FIRST SUBSTRATE AND
A TIN LAYER ON A SECOND SURFACE OF A SECOND SUBSTRATE
810
```
↓
```
MELT THE GOLD LAYER AND THE TIN LAYER AT A TEMPERATURE OF AT
LEAST AN INITIAL MELTING TEMPERATURE TO FORM A BUMP, WHERE A
SUBSEQUENT MELTING TEMPERATURE OF THE BUMP IS HIGHER THAN THE
INITIAL MELTING TEMPERATURE
812
```

FIG. 8

ELECTROPLATED SOLDER FOR HIGH-TEMPERATURE INTERCONNECT

GOVERNMENT LICENSE RIGHTS

The United States government has a paid-up license in this invention and the right in limited circumstances to require the patent owner to license others on reasonable terms as provided for by the terms of Agreement No. HR0011-08-9-0001 awarded by the Defense Advanced Research Projects Administration.

CROSS-REFERENCE TO RELATED APPLICATIONS

This application is related to U.S. Non-provisional patent application Ser. No. 14/109,744, entitled "Electroplated Solder with Eutectic Chemical Composition," by Hiren D. Thacker and John E. Cunningham, filed on Dec. 17, 2013, the contents of which are herein incorporated by reference.

BACKGROUND

1. Field

The present disclosure generally relates to a chip package for semiconductor dies or chips. More specifically, the present disclosure relates to a chip package that includes an interconnect with a multilayer electroplated stack that has an initial melting temperature to form a bump that is different from a subsequent melting temperature to reflow the bump during package assembly.

2. Related Art

An increasingly popular technique to increase the functionality per unit volume in a system is to heterogeneously integrate chips built on different technology platforms (such as digital, photonics, MEMS, analog circuits, mixed-signal circuits, radio-frequency circuits, etc.) onto a common substrate and package platform in which the chips are arranged and stacked in three dimensions. Assembling such a system often involves a step-wise technique in which the individual chips are put together. For example, a flip-chip bonding technique may be used to maximize the number of connections at the interfaces between the chips.

Flip-chip bonding is typically achieved using a thermo-compression or reflow technique. In systems in which chips are flip-chip bonded to other chips, and then multiple chips are flip-chip bonded to a common substrate, there may be multiple different flip-chip bonding operations. Because the flip-chip bonding operations usually involve the use of high-temperature processing, it is often important that pre-attached components are not harmed by subsequent or downstream reflow operations. For example, if a first flip-chip bond is between a first chip and an interposer, then a subsequent reflow/attachment technique between the interposer and the common (package) substrate should not degrade the quality interconnection between the first chip and the interposer. However, existing solder bumps and, more generally, interconnects often can be degraded by subsequent thermal processing, which poses a challenge to integrated multiple chips on a common substrate in a system.

Hence, what is needed is a chip package without the above-described problems.

SUMMARY

One embodiment of the present disclosure provides a chip package that includes a substrate having a surface, and a multilayer electroplated stack disposed on the surface. The multilayer electroplated stack includes one or more instances of alternating layers of gold and tin, where relative thicknesses of the alternating layers, when melted, result in a chemical composition having an initial melting temperature to form a bump and a subsequent melting temperature to reflow the bump that is higher than the initial melting temperature.

For example, the chemical composition may be approximately 80% gold and 20% tin. In some embodiments, the chemical composition includes between approximately 16-80% gold.

Moreover, a given layer in an instance of the alternating layers may have a thickness between 0.5-5 μm.

Furthermore, a difference between the subsequent melting temperature and the initial melting temperature may be approximately 20% of the initial melting temperature.

Additionally, a number of instances of the alternating layers may correspond to a target height of the bump. For example, the target height may be between 5-100 μm.

In some embodiments, the chip package includes a bond pad disposed on the surface and the multilayer electroplated stack is disposed on the bond pad. Moreover, the chip package may include a multilayer stack of nickel and gold disposed between the bond pad and the multilayer electroplated stack. Furthermore, the chip package may include a seed layer disposed between the multilayer stack of nickel and gold and the multilayer electroplated stack. Alternatively or additionally, the chip package may include a copper pillar disposed between the bond pad and the multilayer electroplated stack.

Another embodiment provides a multi-chip module (MCM) that includes: a first substrate having a first surface, where a first bond pad is disposed on the first surface; and a second substrate having a second surface, where a bump disposed on the second surface is coupled to the first bond pad. The bump may include a chemical composition of gold and tin having a subsequent melting temperature to reflow the bump that is higher than an initial melting temperature of the bump. Note that the chemical composition may correspond to a non-equilibrium gold-tin alloy.

Moreover, the second substrate may include a second bond pad disposed on the second surface and the bump may be disposed on the second bond pad. Furthermore, the second substrate may include a multilayer stack of nickel and gold disposed between the second bond pad and the bump. Additionally, the second substrate may include a pillar disposed between the second bond pad and the bump.

Another embodiment provides a method for fabricating a bump. During the method, the multilayer electroplated stack is disposed on the surface of the substrate, where the multilayer electroplated stack includes the one or more instances of alternating layers of gold and tin, and where the relative thicknesses of the alternating layers, when melted, result in a chemical composition having the initial melting temperature. Then, the multilayer electroplated stack is melted at a temperature of at least the initial melting temperature to form the bump, where the subsequent melting temperature to reflow the bump is higher than the initial melting temperature.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a chip package, a multi-chip module (MCM) that includes the chip package, an electronic device that includes the MCM, and a technique for fabricating a bump are described. This chip package includes a substrate having a multilayer electroplated stack disposed on a surface of the substrate. The multilayer electroplated stack may include one or more instances of alternating layers of gold and tin, where relative thicknesses of the alternating layers, when melted, result in a chemical composition having an initial melting temperature to form a bump (which is sometimes referred to as an 'interconnect,' a 'microsolder alloy' or a 'microsolder interconnect') and a subsequent melting temperature to reflow the bump that is higher than the initial melting temperature. For example, the chemical composition may correspond to a non-equilibrium gold-tin alloy.

Alternatively, the chip package may include a gold (or tin) layer that couples to a tin (or gold) layer disposed on a surface of a second substrate. When melted at the initial melting temperature, the gold layer and the tin layer result in an interconnect with the chemical composition having the subsequent melting temperature.

In this way, the chip package may facilitate fabrication of the MCM (or a system) in which different chips or components are bonded (such as flip-chip bonding) to each other and/or a common substrate at different processing temperatures (such as different reflow temperatures). For example, the bump (or interconnect) may be formed at the initial melting temperature, but may not reflow unless the temperature is the subsequent melting temperature. This may allow additional thermal degrees of freedom when fabricating the MCM. Therefore, this interconnect technique may facilitate high-yield (and, thus, lower cost) integration of multiple chips in the MCM, with commensurate improvements in performance. In addition, by using photolithographic techniques to define interconnects, the size and pitch of the interconnects in the chip package (and, more generally, in the MCM) can be scaled down to yield ultrahigh density interconnects (e.g., interconnects with a pitch of 10 μm).

We now describe the chip package. Gold-tin solder (such as an 80:20 gold:tin ratio by weight percent) has been widely used in the electronics and optoelectronics industry because of its thermal, mechanical and electrical properties. For example, because of its high thermal conductivity, gold-tin solder has been used as a reflowable flip-chip interconnect, as well as a die-attach material.

However, gold-tin eutectic alloy in the binary-phase diagram of gold-tin alloy is very sensitive to composition. Consequently, co-evaporation of gold and tin in a vacuum chamber is a common fabrication technique because it offers tight deposition control. Nonetheless, it can be difficult to fabricate gold-tin alloy as microsolder interconnects at the wafer scale. For example, wafer-scale fabrication may involve a time-consuming and complicated fabrication technique with a thick-film resist and liftoff process.

Alternatively, deposition of microsolder interconnects using electroplating is typically difficult because, unlike tin-lead eutectic solder, a single electroplating bath that simultaneously deposits the right composition of gold-tin alloy often does not have a stable chemistry. In the discussion that follows, this challenge is addressed using a multilayer electroplating technique, which results in a wafer-scale gold-tin microsolder interconnect.

Figure 1:
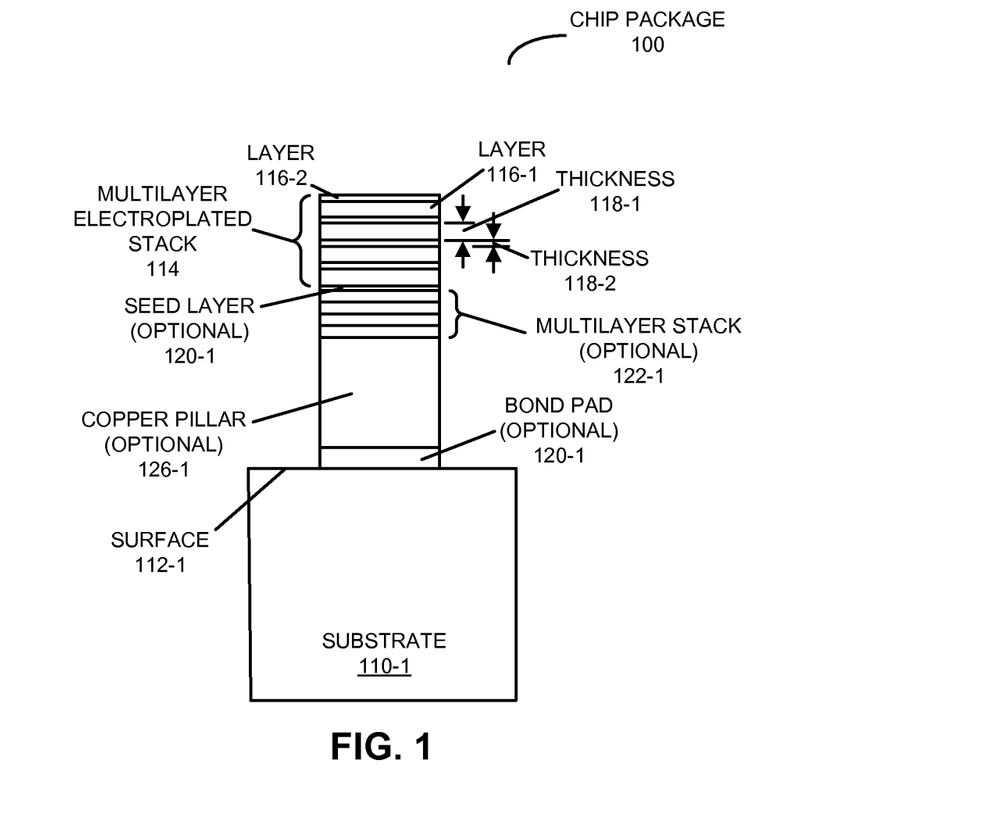
FIG. 1 is a block diagram illustrating a side view of a chip package that includes a multilayer electroplated stack in accordance with an embodiment of the present disclosure.

FIG. 1 presents a block diagram illustrating a side view of chip package 100. This chip package includes: a substrate 110-1 having a surface 112-1, and a multilayer electroplated stack 114 disposed on surface 112-1. Multilayer electroplated stack 114 includes one or more instances of alternating layers 116 of gold and tin, where relative thicknesses 118 of alternating layers 116, when melted, result in a chemical composition having an initial melting temperature to form a bump and a subsequent melting temperature to reflow the bump that is higher than the initial melting temperature.

For example, the chemical composition may be approximately 80% gold and 20% tin. Thus, a gold layer in alternating layers 116 may have a thickness 118-1 of 2 μm and a tin layer may have a thickness 118-2 of 0.5 μm. In some embodiments, the chemical composition includes between approximately 16-80% gold. After melting, multilayer electroplated stack 114 decompensates into intermetallics (or a eutectic alloy) that melts at the subsequent melting temperature. In an exemplary embodiment, a difference between the subsequent melting temperature and the initial melting temperature may be approximately 20% of the initial melting temperature.

Moreover, a given layer in an instance of the alternating layers may have a thickness between 0.5-5 μm. Additionally, a number of instances of alternating layers 116 may correspond to a target height of the bump. For example, the target height may be between 5-100 μm.

In some embodiments, chip package 100 includes an optional bond pad 120-1 disposed on surface 112-1 and multilayer electroplated stack 114 is disposed on optional bond pad 120-1. For example, optional bond pad 120-1 may be gold, and, after melting, the bonding of the solder bump or the interconnect to optional bond pad 120-1 may increase the subsequent melting temperature.

Moreover, chip package 100 may include an optional multilayer stack 122-1 of nickel and gold disposed between optional bond pad 120-1 and multilayer electroplated stack 114. Furthermore, chip package 100 may include an optional seed layer 124-1 disposed between optional multilayer stack 122-1 of nickel and gold and multilayer electroplated stack 114. Alternatively or additionally, chip package 100 may include an optional copper pillar 126-1 disposed between optional bond pad 120-1 and multilayer electroplated stack 114. For example, the use of optional copper pillar 126-1 may allow interconnects with higher aspect ratios to be fabricated.

In an exemplary embodiment, high-density gold-tin microsolder interconnects are fabricated using a stacked electroplating technique. In this fabrication technique, alternating layers of gold and tin are plated onto a target substrate to achieve the desired weight percentage. For example, a 10 μm tall microsolder interconnect may be built up as a gold-tin multilayer electroplated stack with four instances of alternating pairs of gold-tin layers. In this multilayer electroplated stack, the gold layers may have a thickness of 2 μm and the tin layers may have a thickness of 0.5 μm.

Figure 2:
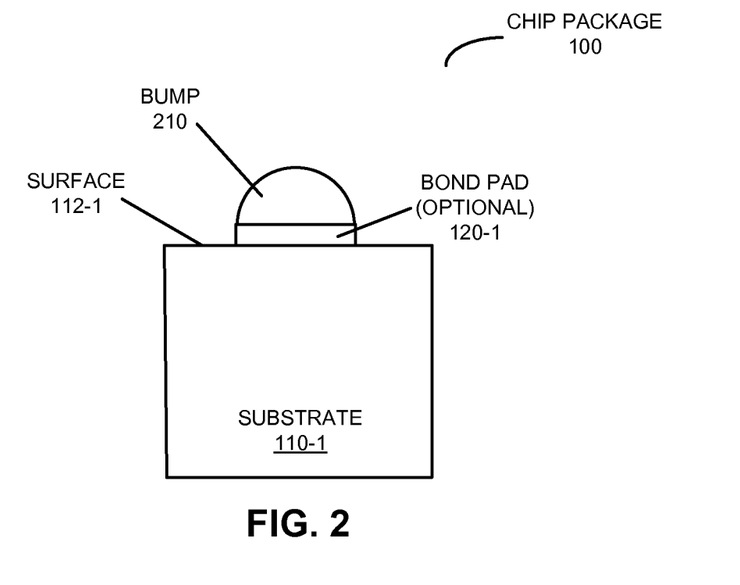
FIG. 2 is a block diagram illustrating a side view of a bump in the chip package of FIG. 1 in accordance with an embodiment of the present disclosure.

After electroplating, multilayer electroplated stack 114 may be put through a reflow cycle with the initial melting temperature to reflow it, so that the two metals intermix to yield an alloy with the desired chemical composition, and a hemispherical shape or a bump results. FIG. 2 presents a block diagram illustrating a side view of bump 210 in chip package 100 (FIG. 1) after exposure to the initial melting temperature. For example, multilayer electroplated stack 114 (FIG. 1) may be melted at 280 C to form bump 210, which, as described further below in FIG. 5, may be attached to another substrate in an MCM. For example, depending on the subsequent thermal-processing requirements, while attaching substrate 110-1 to a ceramic substrate in the MCM, bump 210 may be heated to 300-350 C Because bump 210 now has the higher subsequent melting temperature, the bond with the other substrate may not be adversely affected by exposure to the elevated temperature in the subsequent thermal processing.

In some embodiments, a chip (substrate 110-1) with multilayer bumps is attached to another chip ('substrate 2') and to a package (such as a 'ceramic substrate'). In particular, the plated multilayer stacks on substrates 110-1 and 110-2 (FIG. 5) may be heated to temperature $T_1$ to form the alloy, which has a reflow temperature $T_2$ (where $T_2$ is greater than $T_1$). As such, substrates 110-1 and 110-2 may be bonded at temperature $T_2$ (e.g., 280 C). Subsequently, substrate 110-1 may be heated to 300-350 C (which is greater than $T_2$) to attach it to a ceramic substrate, without affecting bond between 110-1 and 110-2. Depending on the bondpad on substrate 110-2, after substrates 110-1 and 110-2 have been bonded, the melting temperature of the bumps between them may rise due to formation of intermetallics. If the bondpad contains metals that further raise the reflow temperature of the bumps between substrate 110-1 and 110-2, a higher temperature of 300-350 C may not be needed to attach substrate 110-1 to a ceramic substrate. Instead, a 280 C reflow temperature may still be used when bonding substrate 110-1 to a ceramic substrate.

Figure 3:
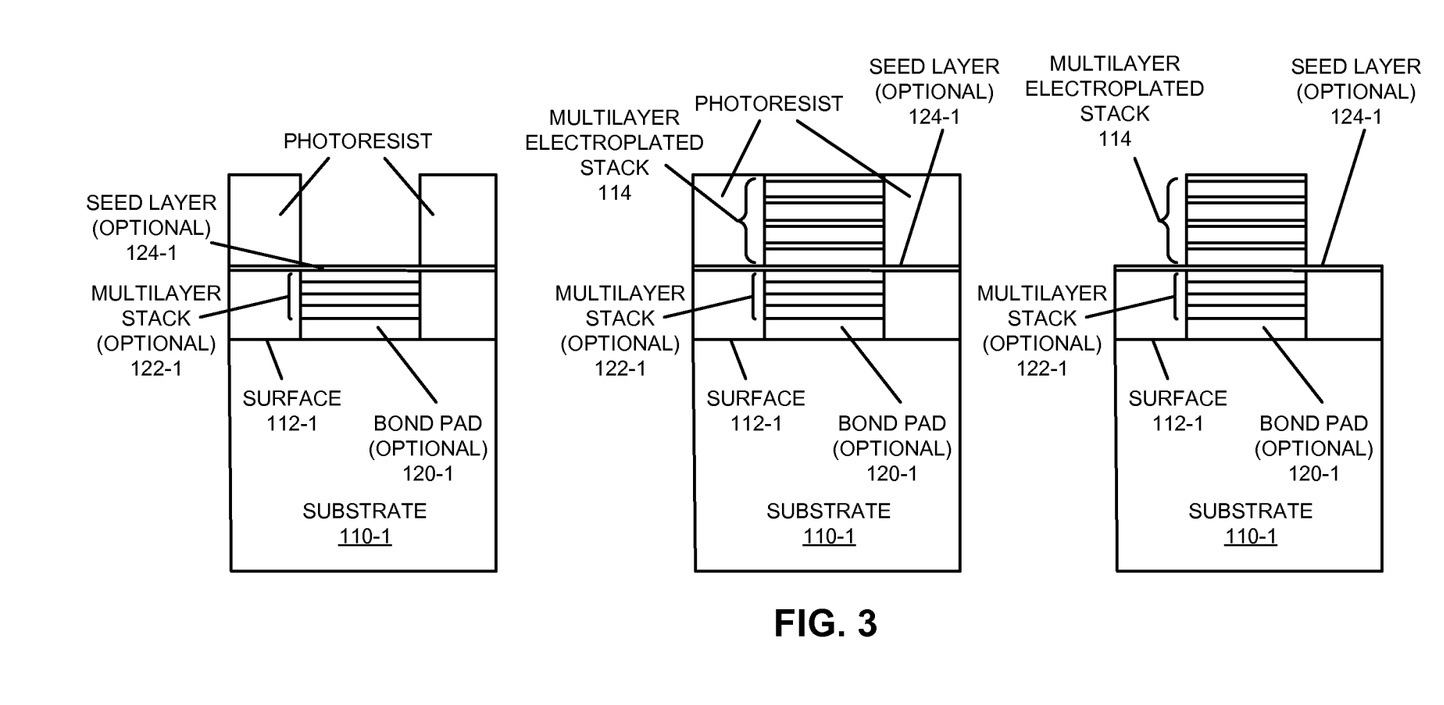
FIG. 3 is a block diagram illustrating a fabrication of the multilayer electroplated stack in FIG. 1 in accordance with an embodiment of the present disclosure.

FIG. 3 presents a block diagram illustrating a fabrication of multilayer electroplated stack 114. In FIG. 3, a suitable under-bump metallization (UBM) layer may be deposited on the bond pads at the wafer-scale. The UBM may provide a strong adhesion layer between the bump and the bond pad, thereby helping to ensure a high-quality electrical contact, and to provide a diffusion barrier. In an exemplary embodiment, the UBM is a multilayer stack, such as nickel and gold, and has a height between 1 and 5 μm. Note that the UBM layer may be deposited via an electroless-plating technique, an electroplating technique, and/or by a physical vapor-deposition technique.

Following fabrication of the UBM layer, a thin-metal seed layer (which may be thinner than 0.5 μm) may be deposited across the entire wafer. The seed layer may provide a conductive path to the wafer during the subsequent electrolytic-plating technique. Next, a photoresist may be applied on top of the wafer, and the photoresist may be patterned to open up the location where the bumps are to be plated. Because the photoresist acts as a mold during the electrolytic-plating technique, the photoresist may have a thickness that is thicker than the targeted bump height. A variety of plating-compatible photoresists (including negative and positive-toned photoresists) may be used. Note that, in the reflow-type bump described in the preceding embodiments, the sidewall profile of the photoresist mold may not be an important process variable.

Next, the wafer may be electrically contacted around the edges and immersed in successive gold and tin electroplating baths. (These operations may be repeated to build up the multilayer electroplated stack.) During the electroplating, the wafer may be connected to the cathode of an external power supply, and a suitable metal in an electroplating bath may provide the anode.

Once the desired metal stack is plated up, the photoresist mold may be removed using a solvent, and the seed layer may be etched away using wet chemistry. In this self-aligned seed-layer removal technique, the multilayer electroplated stack may provide a hard mask. As such, the selection of the seed layer and etchant may be important process variables to ensure that there is no impact on the multilayer electroplated stack or the UBM.

Because the multilayer electroplated stack is defined using photolithography, the bump size and pitch may only be limited by the aspect ratio of the pattern that can be defined in the resist mold, and by the microsolder volume needed to make a metallurgical connection with another chip or substrate. For example, in this way bumps or interconnects with a pitch of 10 μm may be fabricated.

Moreover, by adjusting the individual layer thicknesses, different alloy concentrations may be fabricated. In particular, higher-concentration gold alloys with higher eutectic temperatures may be fabricated by appropriately tuning the layer thickness ratio. Consequently, the fabrication technique may allow a bump or an interconnect that remelts at a substantially higher temperature than its initial melting or reflow temperature. Furthermore, by using ultra-thin layer thicknesses with superlattice structures, bumps with the special metallurgy or chemical composition described previously may also be very different than the bumps with chemical compositions that can only be reached under thermodynamic equilibrium. In fact, special eutectic chemical compositions may be possible in which the remelt temperature is substantially higher than its reflow temperature (which has previously been limited by thermodynamic-equilibrium conditions). For example, these eutectic chemical compositions may occur when local, short-range diffusion locks in spinoidals (or unique alloys stabilized by local stress) that do not form under thermodynamic-equilibrium conditions. As described further below with reference to FIG. 4, a gold-tin eutectic may be fabricated by plating a tin layer on one substrate and a gold layer on another substrate. When the two substrates are assembled into an MCM, the gold layer and the tin layer may be reflowed during the bonding operation instead of during a prior standalone reflow operation (which typically occurs before the bonding).

In some embodiments, the multilayer electroplated stack is fabricated on the substrate using an additive fabrication technique in which material is deposited, plated or, more generally, added. However, in other embodiments a subtractive technique, in which material is removed, is used either separately or in conjunction with the additive technique.

Moreover, the substrate may include: a semiconductor (such as silicon or a silicon-on-insulator wafer), an organic material, a ceramic, glass, and/or a plastic. Furthermore, the multilayer electroplated stack may be fabricated on: a top surface of the substrate, a bottom surface of the substrate, or both.

Note that the fabrication technique described in FIG. 3 may be used in other non-chip-joining applications.

Figure 4:
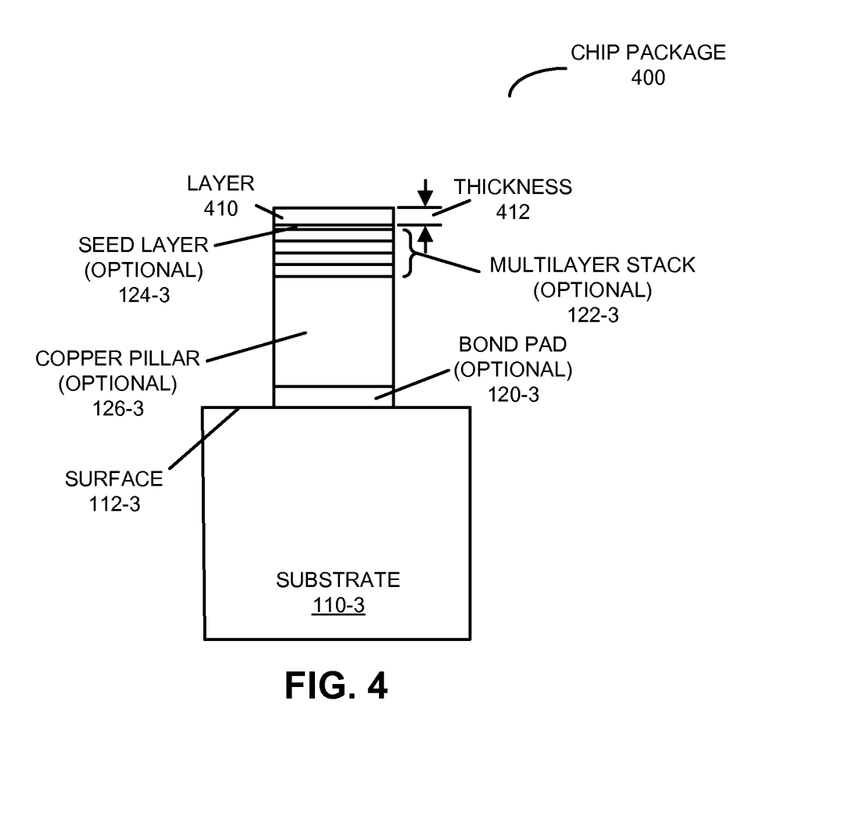
FIG. 4 is a block diagram illustrating a side view of a chip package that includes a gold layer or a tin layer in accordance with an embodiment of the present disclosure.

As noted previously, instead of fabricating an interconnect using the multilayer electroplated stack, a gold layer and a tin layer may be fabricated on separate, facing substrates. When these layers are combined (by heating past the initial melting temperature), the resulting solder bump may have the chemical composition so that the subsequent melting temperature to reflow the bump is higher than the initial melting temperature. This is shown in FIG. 4, which presents a block diagram illustrating a side view of chip package 400. In particular, chip package 400 includes substrate 110-3 having a surface 112-3 with a layer 410, which may be either a gold layer or a tin layer. As described further below with reference to FIG. 5, if layer 410 is a gold layer, it may couple to a tin layer disposed on a surface of another substrate. Alternatively, if layer 410 is a tin layer, it may couple to a gold layer disposed on the surface of the other substrate. In either case, when melted at the initial melting temperature, the gold layer and the tin layer may result in an interconnect with the chemical composition having a subsequent melting temperature to reflow the interconnect that is higher than the initial melting temperature (such as 20% higher). For example, the chemical composition may be a eutectic or a non-equilibrium gold-tin alloy (such as one with 16-80% gold) that has the desired thermal properties. This chemical composition may be selected by choosing thicknesses of the gold and tin layers (such as thickness 412 of layer 410).

Note that the interconnect may have a target height between 5-100 µm. Moreover, chip package 400 may include an optional bond pad 120-3 disposed on surface 112-3 and/or an optional copper pillar 126-3 disposed between optional bond pad 120-3 and layer 410. Furthermore, chip package 400 may include optional multilayer stack 122-3 of nickel and gold disposed between optional bond pad 120-3 and layer 410, and/or optional seed layer 124-3 disposed between optional bond pad 120-3 and layer 410.

Figure 5:
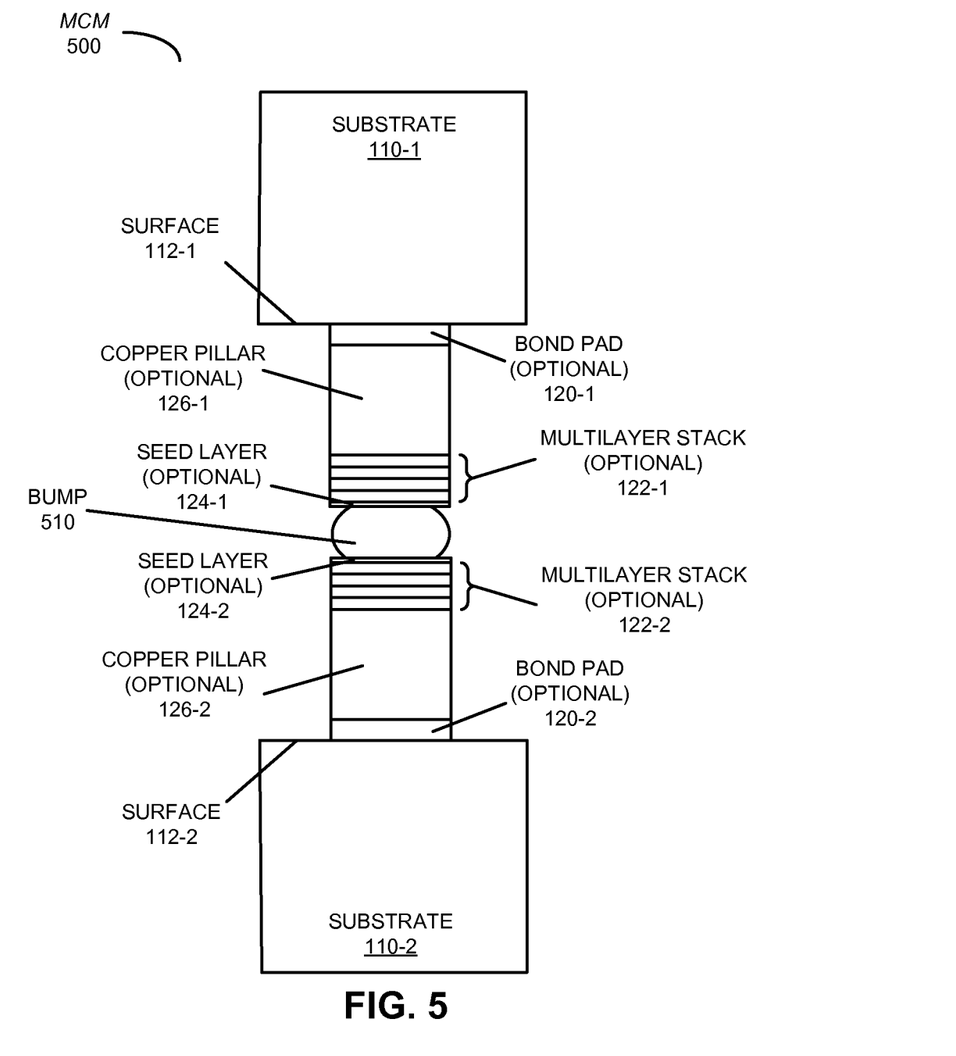
FIG. 5 is a block diagram illustrating a side view of a multi-chip module (MCM) in accordance with an embodiment of the present disclosure.

The preceding embodiments of the chip package may be used in a wide variety of applications. This is shown in FIG. 5, which presents a block diagram illustrating a side view of a multi-chip module (MCM) 500 that may include multilayer electroplated stack 114 (FIG. 1) that is melted at the initial temperature to form a bump 510. Alternatively, MCM 500 may include layers (such as layer 410 in FIG. 4), including a gold layer and a tin layer, that are melted at the initial temperature to form bump 510. In particular, MCM 500 includes: a substrate 110-1 having a surface 112-1, where an optional bond pad 120-1 is disposed on surface 112-1; and a substrate 110-2 having a surface 112-2, where bump 510 disposed on surface 112-2 is coupled to optional bond pad 120-2. Bump 510 may include a chemical composition of gold and tin having a subsequent melting temperature to reflow the bump that is higher than the initial melting temperature of the bump. Note that the chemical composition may correspond to a non-equilibrium gold-tin alloy.

Moreover, substrate 110-2 may include optional multilayer stack 122-2 of nickel and gold disposed between optional bond pad 120-2 and bump 510. Additionally, substrate 110-2 may include optional copper pillar 126-2 disposed between optional bond pad 120-2 and bump 510, and/or optional seed layer 124-2 disposed between optional bond pad 120-2 and bump 510.

Figure 6:
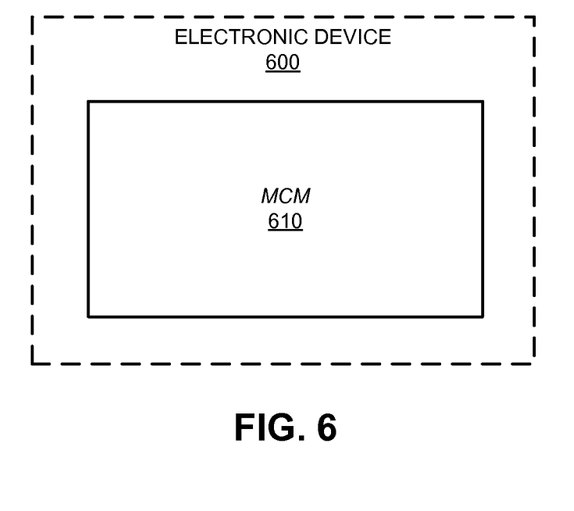
FIG. 6 is a block diagram illustrating an electronic device in accordance with an embodiment of the present disclosure.

Embodiments of the MCM may be used in a wide variety of applications, such as: a die stack in a memory application, flip-chip bonding and/or multilayer stacks. A general application of an MCM is shown in FIG. 6, which presents a block diagram illustrating an electronic device 600. This electronic device includes MCM 610, which may include one or more of the chip packages in the preceding embodiments.

MCM 610 may include: VLSI circuits, communication systems (such as in wavelength division multiplexing), storage area networks, data centers, networks (such as local area networks), and/or computer systems (such as multiple processor-core computer systems). For example, an MCM may be included in a backplane that is coupled to multiple processor blades, or an MCM may couple different types of components (such as processors, memory, I/O devices, and/or peripheral devices). In some embodiments, an MCM performs the functions of: a switch, a hub, a bridge, and/or a router.

Note that electronic device 600 may include, but is not limited to: a server, a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, and/or another electronic computing device. Moreover, note that a given computer or computer system may be at one location or may be distributed over multiple, geographically dispersed locations.

The embodiments of the chip package, the MCM and/or the electronic device may include fewer components or additional components. Furthermore, although the chip package, the MCM and the electronic device in the preceding discussion are illustrated as having a number of discrete items, these embodiments are intended to be functional descriptions of the various features that may be present rather than structural schematics. Consequently, in these embodiments two or more components may be combined into a single component, and/or a position of one or more components may be changed.

Additionally, note that components in the chip package and the MCM may be fabricated, and the MCM may be assembled, using a wide variety of techniques, as is known to one of skill in the art.

Figure 7:
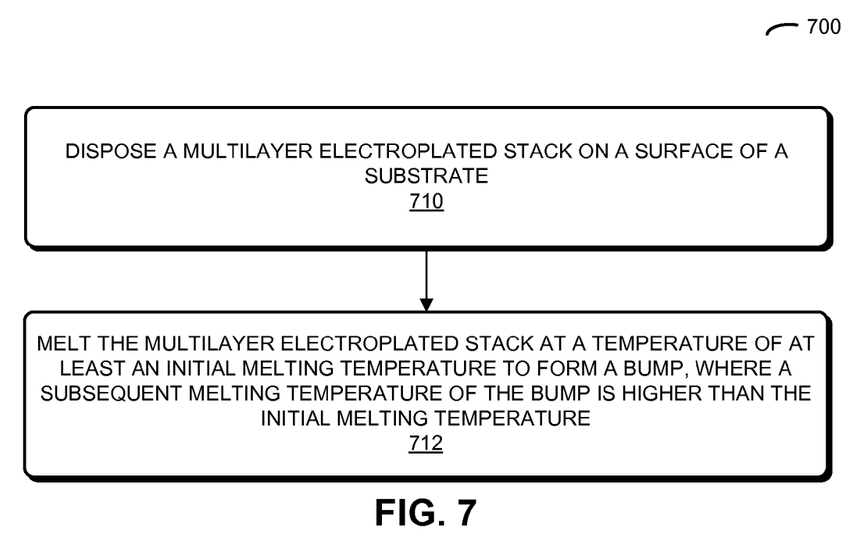
FIG. 7 is a flow diagram illustrating a method for fabricating a bump in accordance with an embodiment of the present disclosure.

We now describe embodiments of the method. FIG. 7 presents a flow diagram 700 illustrating a method for fabricating a bump. During this method, a multilayer electroplated stack is disposed on a surface of a substrate (operation 710), where the multilayer electroplated stack includes one or more instances of alternating layers of gold and tin, and where relative thicknesses of the alternating layers, when melted, result in a chemical composition having an initial melting temperature. Then, the multilayer electroplated stack is melted at a temperature of at least the initial melting temperature to form the bump, where a subsequent melting temperature to reflow the bump is higher than the initial melting temperature (operation 712).

Figure 8:
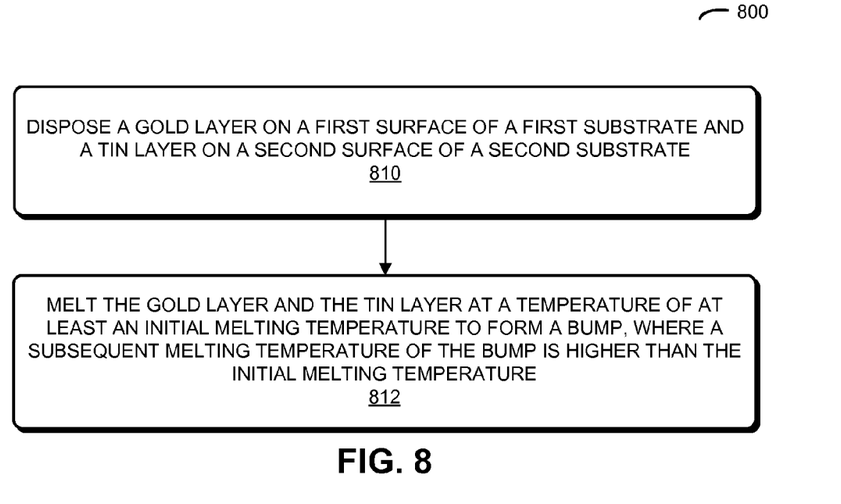
FIG. 8 is a flow diagram illustrating a method for fabricating a bump in accordance with an embodiment of the present disclosure.

FIG. 8 presents a flow diagram 800 illustrating a method for fabricating a bump. During this method, a gold layer is disposed on a first surface of a first substrate and a tin layer is disposed on a second surface of a second substrate (operation 810), where, when melted, the gold layer and the tin layer result in a chemical composition having an initial melting temperature. Then, the gold layer and the tin layer are melted at a temperature of at least the initial melting temperature to form the bump (operation 812), where a subsequent melting temperature to reflow the bump is higher than the initial melting temperature.

In some embodiments, methods 700 (FIG. 7) and/or 800 include additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
a substrate having a surface; and
a multilayer electroplated stack, disposed on the surface, with one or more instances of alternating layers of gold and tin, wherein relative thicknesses of the alternating layers, when melted, result in a chemical composition having an initial melting temperature to form a bump and a subsequent melting temperature to reflow the bump that is higher than the initial melting temperature,
wherein the chip package further includes a bond pad disposed on the surface and the multilayer electroplated stack is disposed on the bond pad, and wherein the chip package further includes a multilayer stack of nickel and gold disposed between the bond pad and the multilayer electroplated stack.

2. The chip package of claim 1, wherein the chemical composition is approximately 80% gold and 20% tin.

3. The chip package of claim 1, wherein the chemical composition includes between approximately 16-80% gold.

4. The chip package of claim 1, wherein a given layer in an instance of the alternating layers has a thicknesses between 0.5-5 μm.

5. The chip package of claim 1, wherein a difference between the subsequent melting temperature and the initial melting temperature is approximately 20% of the initial melting temperature.

6. The chip package of claim 1, wherein a number of instances of the alternating layers corresponds to a target height of the bump.

7. The chip package of claim 6, wherein the target height is between 5-100 μm.

8. The chip package of claim 1, wherein the chip package further includes a seed layer disposed between the multilayer stack of nickel and gold and the multilayer electroplated stack.

9. The chip package of claim 1, wherein the chip package further includes a copper pillar disposed between the bond pad and the multilayer electroplated stack.

10. A multi-chip module (MCM), comprising:
a first substrate having a first surface, wherein a first bond pad is disposed on the first surface; and
a second substrate having a second surface, wherein a bump disposed on the second surface is coupled to the first bond pad, and
wherein the bump includes a chemical composition of gold and tin having a subsequent melting temperature to reflow the bump that is higher than an initial melting temperature of the bump,
wherein the second substrate further includes a second bond pad disposed on the second surface and the bump is disposed on the second bond pad, and wherein the second substrate further includes a multilayer stack of nickel and gold disposed between the second bond pad and the bump.

11. The MCM of claim 10, wherein the chemical composition corresponds to a non-equilibrium gold-tin alloy.

12. The MCM of claim 10, wherein the chemical composition is approximately 80% gold and 20% tin.

13. The MCM of claim 10, wherein the chemical composition includes between approximately 16-80% gold.

14. The MCM of claim 10, wherein a difference between the subsequent melting temperature and the initial melting temperature is approximately 20% of the initial melting temperature.

15. The MCM of claim 10, wherein the second substrate further includes a copper pillar disposed between the second bond pad and the bump.

16. A method for fabricating a bump, the method comprising:
disposing a multilayer electroplated stack on a surface of a substrate, wherein the multilayer electroplated stack includes one or more instances of alternating layers of gold and tin, and wherein relative thicknesses of the alternating layers, when melted, result in a chemical composition having an initial melting temperature; and
melting the multilayer electroplated stack at a temperature of at least the initial melting temperature to form the bump, wherein a subsequent melting temperature to reflow the bump is higher than the initial melting temperature.

17. The method of claim 16, wherein the chemical composition is approximately 80% gold and 20% tin.

18. The method of claim 16, wherein the chemical composition includes between approximately 16-80% gold.

19. The method of claim 16, wherein a given layer in an instance of the alternating layers has a thickness between 0.5-5 μm.

20. The method of claim 16, wherein a difference between the subsequent melting temperature and the initial melting temperature is approximately 20% of the initial melting temperature.

* * * * *